United States Patent
de Ruijter

(10) Patent No.: US 9,510,289 B1
(45) Date of Patent: Nov. 29, 2016

(54) IN SYSTEM CALIBRATION OF WAKE UP TIMER

(71) Applicant: Silicon Laboratories Inc., Austin, TX (US)

(72) Inventor: Hendricus de Ruijter, Sunnyvale, CA (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 14/934,058

(22) Filed: Nov. 5, 2015

(51) Int. Cl.
*H04B 7/00* (2006.01)
*H04W 52/02* (2009.01)
*H03L 7/14* (2006.01)

(52) U.S. Cl.
CPC .......... *H04W 52/0235* (2013.01); *H03L 7/148* (2013.01)

(58) Field of Classification Search
None
See application file for complete search history.

(56) References Cited

U.S. PATENT DOCUMENTS

| | | | | |
|---|---|---|---|---|
| 860,056 A * | 7/1907 | Poetzl | D04B 1/26 | 66/182 |
| 5,202,532 A * | 4/1993 | Haglund | F42D 1/05 | 102/215 |
| 5,809,142 A * | 9/1998 | Hurta | G06Q 20/3676 | 340/928 |
| 5,842,141 A * | 11/1998 | Vaihoja | H04W 52/0254 | 340/7.1 |
| 5,902,933 A * | 5/1999 | Bingo | G01L 9/125 | 361/283.4 |
| 6,593,845 B1 * | 7/2003 | Friedman | G06K 19/0701 | 340/10.1 |

(Continued)

OTHER PUBLICATIONS

A. Paidimarri et al., "A 120nW 18.5kHz RC Oscillator with Comparator Offset Cancellation for ±0.25% Temperature Stability." 2013 IEEE International Solid-State Circuits Conference Digest of Technical Papers (ISSCC), Feb. 2013, 3 pages.

(Continued)

*Primary Examiner* — Dominic Rego
(74) *Attorney, Agent, or Firm* — Polansky & Associates, P.L.L.C.

(57) ABSTRACT

A wireless transceiver includes receiver front-end circuitry for processing an ingoing radio frequency (RF) signal to produce an in-going digital signal to a processor connected to receive the in-going digital signal. The processor includes sync word determination logic configured to identify a received sync word or other event or connection point and to subsequently generate an event determination signal. A low power oscillator produces low frequency pulses to a first counter. A crystal oscillator that produces higher frequency pulses to a second counter is used for the last portion of the desired sleep time for greater resolution. Thus, a calibration controller receives pulse counts from at least one of the first and second counters and determines a period between a common event of subsequent beacon signals or connection events and determines wake up times based on the received pulse counts from at least one of the first and second counters.

21 Claims, 5 Drawing Sheets

(56) References Cited

U.S. PATENT DOCUMENTS

| | | | | |
|---|---|---|---|---|
| 6,668,025 | B1* | 12/2003 | Sumi | H04L 27/3854 |
| | | | | 375/326 |
| 6,735,183 | B2* | 5/2004 | O'Toole | H03L 7/0995 |
| | | | | 340/10.33 |
| 7,684,383 | B1* | 3/2010 | Thompson | H04M 7/1295 |
| | | | | 370/352 |
| 7,936,227 | B2* | 5/2011 | Young | G01S 19/34 |
| | | | | 331/116 R |
| 2004/0051752 | A1* | 3/2004 | Asauchi | B41J 2/17513 |
| | | | | 347/19 |
| 2007/0242771 | A1* | 10/2007 | Kondo | G06F 1/1616 |
| | | | | 375/295 |
| 2008/0150797 | A1* | 6/2008 | Jia | G01S 19/34 |
| | | | | 342/357.74 |
| 2009/0003422 | A1* | 1/2009 | Ha | H04B 14/006 |
| | | | | 375/225 |
| 2009/0046611 | A1* | 2/2009 | Ryu | H04W 52/0216 |
| | | | | 370/311 |
| 2010/0176823 | A1* | 7/2010 | Thompson | G06K 9/00026 |
| | | | | 324/676 |
| 2011/0065392 | A1* | 3/2011 | Chung | H04B 7/0805 |
| | | | | 455/67.11 |
| 2012/0025844 | A1* | 2/2012 | Morita | B60L 3/0023 |
| | | | | 324/538 |
| 2012/0154032 | A1* | 6/2012 | Lesso | H03F 1/304 |
| | | | | 330/109 |
| 2014/0093019 | A1* | 4/2014 | Oehler | H04B 1/71637 |
| | | | | 375/343 |
| 2015/0130387 | A1* | 5/2015 | Tarui | B60L 15/08 |
| | | | | 318/603 |

OTHER PUBLICATIONS

D. Griffith et al., "A 190nW 33kHz RC Oscillator with ±0.21% Temperature Stability and 4ppm Long-Term Stability," 2014 IEEE International Solid-State Circuits Conference Digest of Technical Papers (ISSCC), Feb. 2014, pp. 300-302.

* cited by examiner

IN SYSTEM CALIBRATION OF WAKE UP TIMER

FIELD OF THE DISCLOSURE

The present disclosure relates generally to power control, and more particularly to a system and logic to reduce power consumption.

BACKGROUND

Energy saving is of prime importance for wireless devices, especially those wireless devices that operate on either harvested energy or very small batteries such as coin cells. With the explosion of portable and wearable devices along with the miniaturization of electronics, computing capability is finding itself in many applications for which one would not have expected computerization in the recent past. Because, however, many of these devices have low processing demands and it is greatly desirable to extend battery life, many approaches have been taken to reduce power consumption to enhance battery life.

Approaches to reduce energy consumption include continuously trying to reduce circuit size and unnecessary functionality to reduce required power. Additionally, high gain antennas with low-power transmissions and advanced error correction techniques have been utilized to reduce power. One common approach to saving power is to place systems, circuit blocks, and even circuit elements into a powered down or sleep state until needed. Because many of these portable electronics utilize a communication protocol with a periodic beacon, such as the connection events in Bluetooth, designers have implemented designs to place radio transceiver circuitry into a sleep mode in between beacons. With such designs, a receiver circuit is powered back up prior to an expected beacon transmission time (or other communication event) by a wake up timer in the remote device. Because of limited precision and drift in these low power wake up timers, these receiver circuits are often powered backup unnecessarily early for the sake of ensuring that the transmitted beacon is not missed. These unnecessary early wake ups waste energy. A need exists, therefore, to improve the precision of the wake up timer to reduce this waste.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
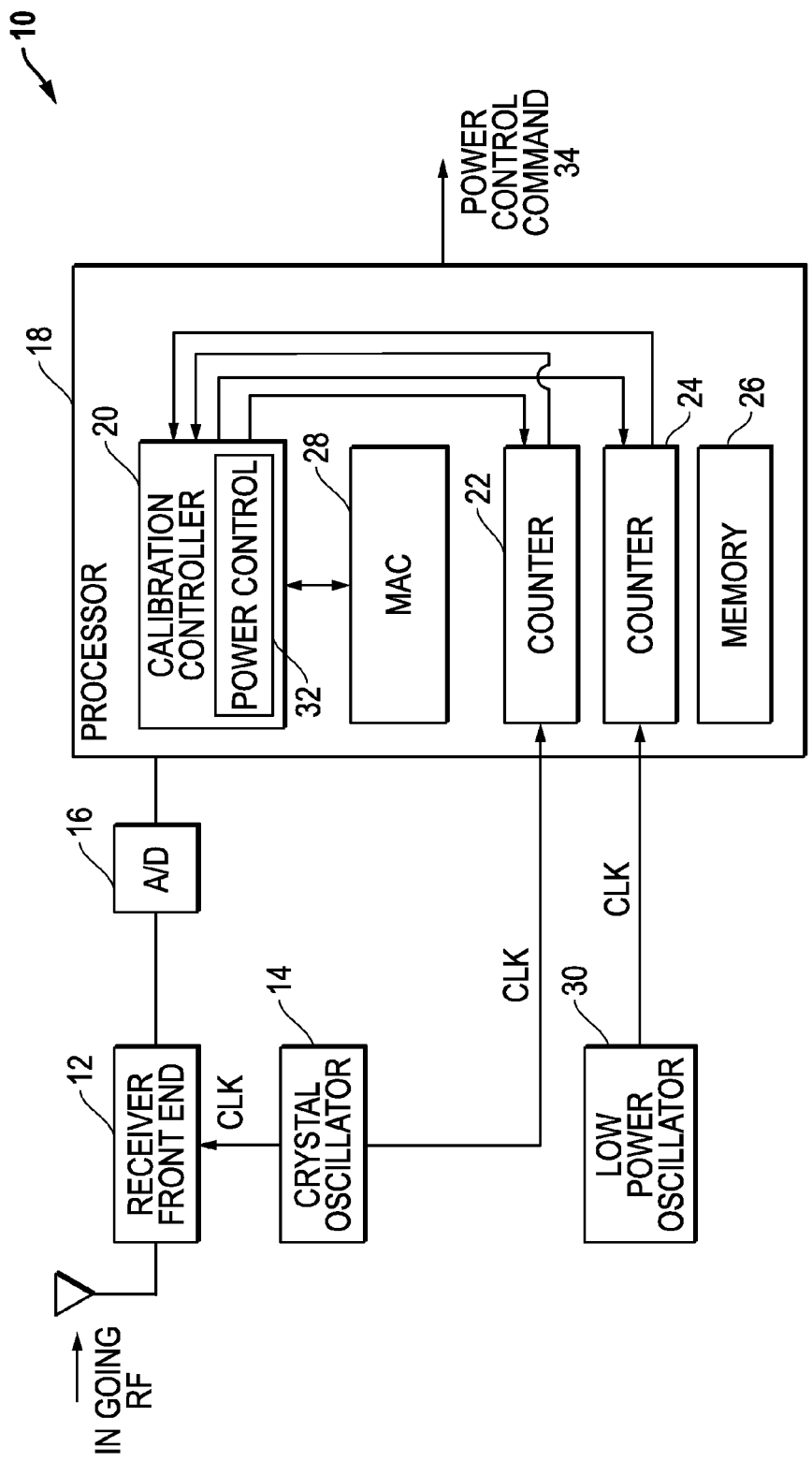
FIG. 1 is a functional block diagram of a receiver according to one embodiment.

FIG. 1 is a functional block diagram of a receiver according to one embodiment. Referring to FIG. 1, a receiver 10 includes a receiver front end 12 that is connected to an antenna and is configured to receive an in-going radio frequency (RF) signal. Receiver front end 12 is also connected to receive a clock signal from a crystal oscillator 14. Receiver 12 is further connected to produce an in-going intermediate or low frequency signal to an Analog to Digital Converter (ADC) 16. ADC 16 is connected to produce a digital signal that corresponds to the received analog signal to processor 18. Processor 18 further includes circuitry and logic that won't be described here which is routine and well known in the art that perform standard signal processing. Additionally, processor 18 includes a calibration controller 20 for controlling sleep times, a counter 22 for counting pulses produced by a first oscillator, a counter 24 for counting pulses produced by a second oscillator, a medium access control (Mac) block 28 for managing physical layer communications and processing, and a memory 26 for storing data and computer instructions that defined the operational logic of processor 18.

One aspect of the embodiments is that a system, structure and method support more accurate determination of sleep times that may be applied to a variety of communication protocols or systems. In Bluetooth, for example, data transmission happens in the form of connection events in which the master and the slave wake up at the end of a sleep time in synchrony to exchange frames. The Bluetooth Low Energy (BLE) specification allows setting the connection interval to values ranging from 7.25 ms to 4 s. In addition, the slave may skip some of the connection events so that maximum effective connection interval is 32 s. During a sleep state a low power wake up timer is used which provides a wake up signal to activate its receiver just before the expected connection event at the end of a sleep time. To minimize energy consumption during sleep time, these timers are usually designed trading off precision in return for a reduction in power consumption. In addition, to keep the cost low, theses timers are preferably running from a low power RC oscillator but may also run from a MEMS oscillator or an external resonator like a crystal. When a low power RC oscillator is used the precision of the wake up timer can be as much as 2500 ppm. With a 2500 ppm frequency error and a sleep period of 32 seconds, the receive activation may need to start 80 ms in advance. To put this in to perspective, a maximum length BLE frame is 376 is (47 Bytes). In this example, on average, the device has it receiver enabled about 200 times longer than is necessary to receive the frame. Accordingly, one aspect of the various embodiments is that a sleep time is determined with greater precision which therefore reduces power consumption.

Counter 22 is connected to receive clock pulses from crystal oscillator 14. Counter 24, on the other hand, is connected to receive clock pulses from a low-power oscillator 30. Referring again to calibration controller 20, it may be seen that calibration controller 20 further includes a power control block 32 that defines the operational logic for determining a sleep time and therefore when to wake up a circuit element, block or device that has placed into a power down state such as a sleep state prior to the receipt or processing of in-going beacon signals and other communication signals. Based on the logic within power control block 32 and a preprogrammed precision value, processor 18 generates power control commands 34 at the end of a determined sleep time to wake up circuitry prior to receiving a subsequent beacon or periodic signal. Note that the preprogrammed precision value is related to the precision of the oscillator(s) used for timing the sleep period and may be obtained through device characterization.

One aspect of the embodiments of the present invention is that the timing used for calculating a sleep time is based on a measured time between corresponding subsequent events of the same type from the same source, like measuring time between a sync word detection in one beacon and the sync word detection of a previous beacon. It should be understood that all references herein this specification to subsequent beacons or detected events refer to common events for subsequent signals from the same transmitting source (having the same transmitter ID).

In contrast, many prior art transceivers calibrate their wake up timers using their crystal oscillator as a reference and run this calibration outside the operational modes of the transceiver. For better precision the calibration period needs to be long and requires recalibration when temperature changes. One problem with this approach, however, is that it does not account for the temperature profile associated with the operational modes of the transceiver. Accordingly, one aspect of the embodiments is that sleep times are based on the reception of specified signals or the reception of specified consecutive signal events. Accordingly, any timing variations, due to the device, network or system conditions, including variations impacted by operational temperature profiles, are automatically accounted for as the sleep time is based on actual times and not expected times. A time between specified events for subsequent signals is measured to determine actual separation based on all device, network or system conditions.

To accomplish this, for example, an amount of time between two corresponding sync words, or preambles, or even payloads is measured and then used to determine the sleep time for a circuit for subsequent sleep times. Another aspect of the embodiment is that a counter that counts pulses of either a low-power oscillator or a crystal oscillator or both to determine either a portion of or all of the timing. In one embodiment, only the pulses of the low-power oscillator are used to determine sleep times. In another embodiment, only the pulses of the crystal oscillator are used to determine sleep times. In yet another embodiment, two counters are utilized and a combination of counted pulses from both the low power oscillator and the crystal oscillator are used to determine sleep times.

This approach provides a combination of precision and power savings. For example, because the crystal oscillator consumes more power than the low-power oscillator, one embodiment contemplates utilizing the low-power oscillator low frequency pulse count until the sleep time is close to ending (the beacon is within one or just a few cycles of the low power oscillator of an expected arrival of a subsequent beacon signal), and then switching to counting pulses from the crystal oscillator to determine the actual end of the sleep time. A sleep time for this embodiment is therefore equal to a first specified number of pulses from the low power low frequency oscillator added to a second specified number of pulses from a high frequency crystal oscillator. Because the pulses of the crystal oscillator are higher frequency with a corresponding lower period, greater precision may be realized for setting sleep times without requiring the high frequency crystal oscillator to operate during most of the duration of the sleep time. It should be noted that the crystal oscillator itself must be woken up to allow its clock to settle and reach steady state prior to using its pulses to determine a wake time for another circuit, device, element or block.

One aspect of the pulses of the crystal oscillator in relation to the low-power oscillator is that the low-power oscillator pulses have a much greater period and lower frequency. Accordingly, the high frequency crystal oscillator pulses give greater resolution and allow circuits to be left in a sleep mode for a longer sleep time. In one embodiment, the low-power oscillator low frequency pulses are used for a first portion of determining the sleep time and the high frequency and high resolution pulses of the crystal oscillator are used for a second portion of the sleep time to determine when to wake up a circuit, element, device or block.

In operation, receiver 10 receives a beacon that includes a preamble, a sync word and a payload. When a receiver front end of the receiver receives a beacon, it performs front end processing including amplification, filtering, tuning, etc., to produce an in-going signal to ADC 16. ADC 16 then produces an in-going digital signal to processor 18. Processor 18 includes logic and circuitry to process the in-going signal to identify the in-going signal and particularly to determine that it is a beacon. One aspect of the embodiment of the present invention is that once an event is detected (e.g., the beginning of a preamble or sync word of the beacon is identified), that at least one of the two counters start counting pulses produced by an associated oscillator. These pulses are counted until that specified event of a subsequent beacon is detected. Accordingly, the pulse counts are used to identify the separation between consecutive beacons. This identified separation in time is the value that is used to drive subsequent sleep time determinations.

Because the embodiment of the invention includes a crystal oscillator as well as a low-power oscillator, and a counter is connected to receive pulses for each, the various embodiments of the invention include:

a) using only pulses from the crystal oscillator to determine a sleep time;
b) using only pulses from the low-power oscillator to determine the sleep time; or
c) using a combination of low-power oscillator pulses and crystal oscillator pulses to determine the sleep time.

Depending on the length of the periods between beacons and the required resolution and further, the importance of not missing a beacon, different approaches may be utilized to save power. Generally, however, because the low-power oscillator with less resolution saves power, it is desirable to use the low-power oscillator to the greatest extent possible either without using the crystal oscillator to determine a sleep time or to minimize the amount that the crystal oscillator is used to generate pulses to determine the sleep time. It should be understood that different portions of a beacon might be used. For example, either the beginning or the end of two preambles may be used, the beginning or end of two sync words may be used, or the beginning of two consecutive payloads may be used to determine the interval between beacons and the maximum length of a sleep time. This approach may be adjusted. For example, the number of clocks between the end of preamble detection in one frame and the sync word detection in the subsequent frame may be measured. The beacon interval can still be accurately calculated because the length of the sync word is known.

Figure 2:
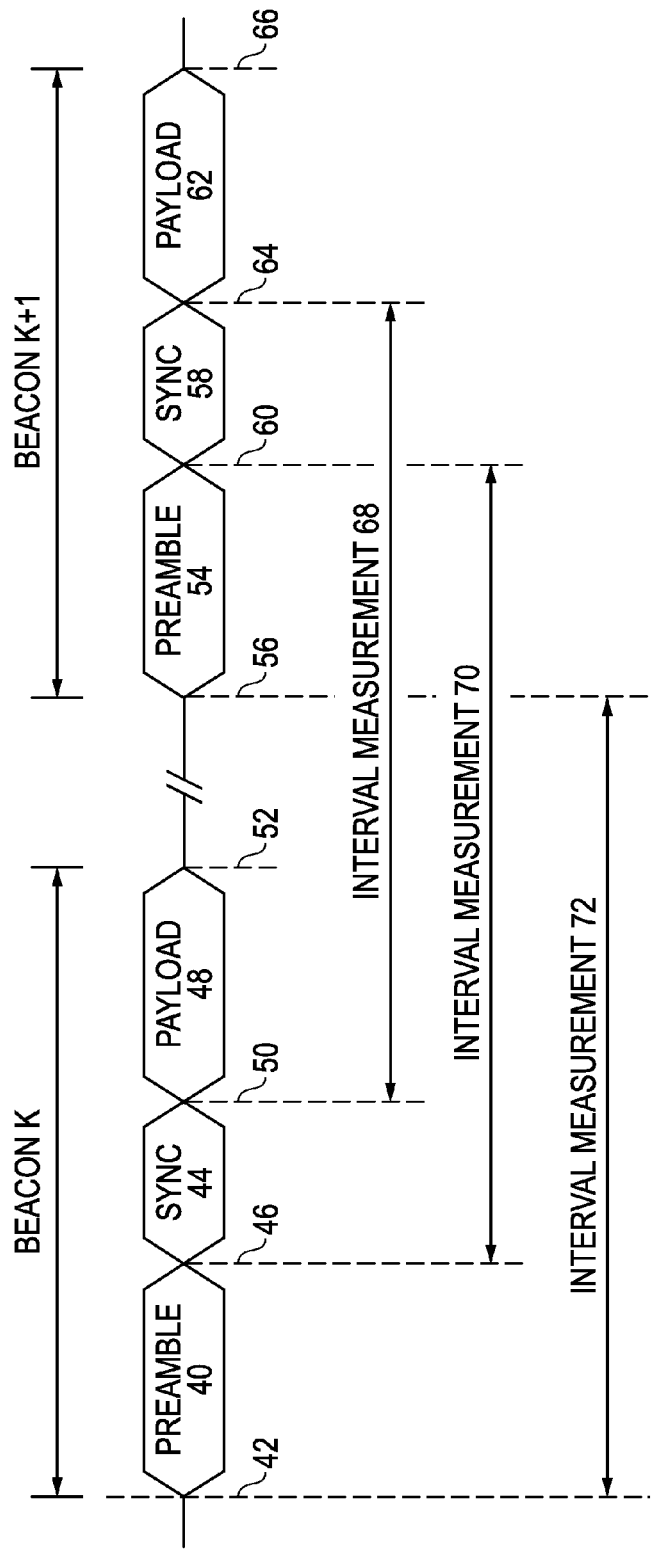
FIG. 2 is a signal flow diagram that illustrates a plurality of beacons and the portions of a beacon that may be used as a part of determining a sleep time.

FIG. 2 is a signal flow diagram that illustrates a plurality of beacons and the portions of a beacon that may be used as a part of determining the sleep time. As may be seen, a beacon "k" includes a preamble 40 that begins at time 42, a sync word 44 that beings at time 46, and a payload 48 that begins at time 50 and ends at time 52. A second beacon "k+1" has a preamble 54 that begins at time 56, a sync word 58 that begins at time 60, and a payload 62 that begins at time 64 and ends at time 66. As may be seen, an interval measurement 68 begins at time 50, which is the beginning of payload 48 and extends to a time 64 that is the beginning of payload 62. An interval measurement 70 begins at a time 46 that is the beginning of sync word 44 and extends to the time 60 that is the beginning of sync word 58. Finally, an interval measurement 72 begins at time 42 that is the beginning of preamble 40 and ends at time 56 that is the beginning of preamble 54.

One aspect demonstrated by FIG. 2 is that the interval measurement occurs between equivalent events of subsequent beacons. Accordingly, references herein to event determination are references to determining, for example, that a preamble is beginning, that a sync word is beginning, or that a payload is beginning Other events may also be used so long as the events are between subsequent beacons from the same source. A source ID is typically used to make this verification. In one embodiment, an event determination signal is generated for a specified event. Oscillator pulses are counted once the event determination signal is generated and are counted until a subsequent event determination signal is generated. In one embodiment, an event determination signal is generated, in one embodiment, based upon determining at least one of a sync word, a payload, a preamble, a source address, a frame type, a network ID, a beacon frame and a connection event.

Figure 3:
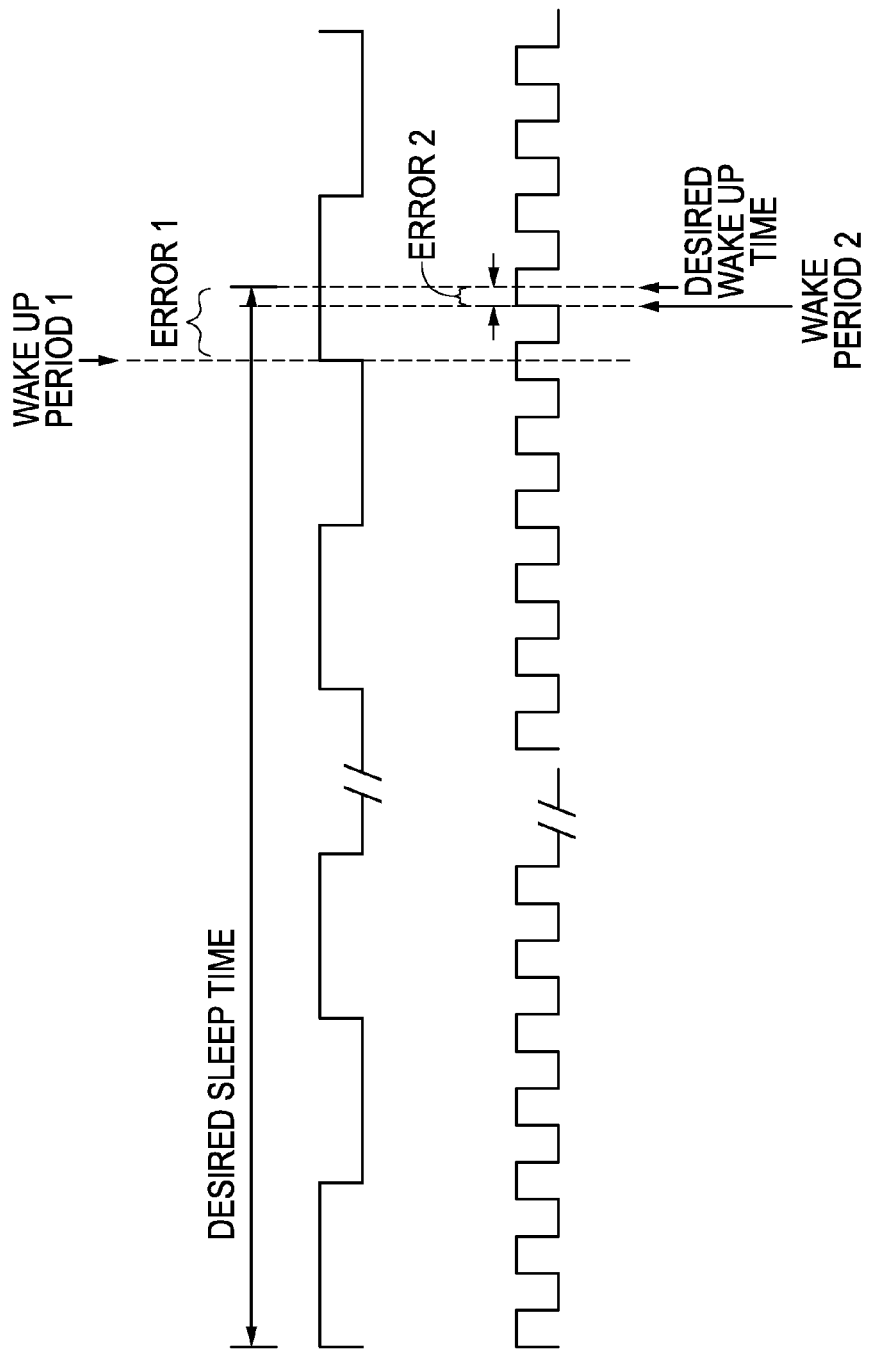
FIG. 3 is a signal diagram that illustrates a relationship between interval measurement periods and pulses produced by the low-power oscillator and the crystal oscillator with respect to a calculated wake up period.

FIG. 3 is a signal diagram that illustrates a relationship between desired sleep time and pulses produced by the low-power oscillator and the crystal oscillator with respect to a desired sleep time. Generally, it may be seen that for a given desired sleep time, that if the low power oscillator pulses are used exclusively to determine a sleep time, that the sleep time will end early and will be less than the length of one low frequency low-power oscillator pulse. The difference between using the desired sleep time and WAKE UP PERIOD 1 which is a wake up period that results from using only the pulses of the low-power oscillator in relation to a desired wake-up time to not miss a beacon signal is shown as ERROR 1. The difference between the desired sleep time and WAKE UP PERIOD 2 which is a wake up period that results from using the pulses of the crystal oscillator in relation to the desired wake-up time to not miss a beacon signal is shown as ERROR 2.

As may be seen, ERROR 2 will typically be lower or smaller than ERROR 1. The signals of FIG. 3 thus suggest that greater resolution and maximum sleep time may be achieved by using the pulses of the crystal oscillator. Using the crystal oscillator, however, consumes more power than using the low-power oscillator. Alternatively, according to one embodiment, a combination of the two may be used wherein low-power oscillator is used initially and then the crystal oscillator is used to count pulses only when the sleep time is within a certain threshold value or is close to the start of an expected frame. Accordingly, the low-power oscillator is used to count pulses to monitor the passing of time for the majority of the sleep time or the length of the desired sleep time.

In an IEEE802.15.4 beacon enabled mode, the end nodes are locked on to a beacon that is transmitted by a personal area network (PAN) coordinator using a fixed time interval. Data transfers soon after the beacon. If there is no data to be transferred, the end nodes will return to a low power sleep state in which they run a low power timer that will time-out at the end of a sleep time and wake-up the receiver just before a next beacon is transmitted. Depending on the application, an end node may conserve energy by skipping beacons. E.g. an electronic shelf label may not require to receive price updates every second but a security alarm may need much shorter intervals.

In Bluetooth, to save energy, slaves may be in sleep mode by default and wake up periodically to listen for possible packet receptions from the master. The master determines the instants at which it initiates the connection events (7.5 ms to 4 s), and thus coordinates the medium access by using a Time Division Multiple Access (TDMA) scheme. Depending on the application, a slave device may decide to skip some of these connection events to help it to conserve energy requiring sleep periods of up to 32 seconds. E.g. with 500 ppm frequency error and a sleep period of 4 seconds, the receive activation may need to start 2 ms in advance to not miss the desired connection. This will add to the energy consumption. To put this in to perspective, a maximum length BTLE frame is 376 microseconds (47 Bytes) long. A more precise sleep time thus will help to prolong the battery life. Accordingly, obtaining more precise information regarding the period that separates subsequent beacons or connection events allows for more precise sleep times that then reduce power consumption.

The precision of the RC timer is affected by the RC oscillator design, the calibration procedure and the temperature profile during the sleep and active cycle. In prior art systems the calibration of the RC oscillator is usually done by counting cycles, during a calibration period, of the crystal oscillator during fixed number of cycles of the RC oscillator. Before this calibration can be started, the RC oscillator requires some cycles to settle. Assuming a 32 MHz crystal oscillator, no noise and perfect settling, a calibration period of 1 ms results in 32,000 cycles. Being one cycle off translates to an error of 31 ppm. However, when the circuit noise is included, the accuracy of this calibration procedure is heavily impacted by the length of the calibration period. Across the calibration period, typically around 1 ms, the oscillation frequency of the RC oscillator may deviate significantly from the longer-term frequency. In other words, the oscillation frequency during the short calibration period may not be representative for the longer-term frequency. This effect can be observed from Allan deviation curves of the low power oscillators that control the sleep time.

Allan deviation is a measure of how much the frequency of an oscillator changes from one sample interval of duration τ to the next interval. The Allan deviation is flat, meaning independent of the sample interval, only for longer calibration periods where the effects of flicker noise dominates the effects of the white noise. The white noise in the oscillator circuitry, however, will cause the Allan deviation to go up as the calibration period is shortened. In a typical RC oscillator design the Allan deviation starts to become independent from the sample interval at sample intervals beyond 1 second.

For a prior art calibration of the wake up timer this means that the calibration period needs to be 1 second or longer. In most communication systems a calibration period of 1 second is much longer than the frame duration which impacts the energy efficiency. Recalibrations are required when temperature changes. Note that the device that transmits the beacon may have different temperature variation compared to the receiving. This affects the precision of the wake up timer.

In the embodiments herein the calibration works out favorably because longer beacon intervals, where high precision wake up is more important for saving energy, provide for longer calibration periods which helps to reduces the afore mentioned effects of white noise. In turn, a more accurate wake up time can be obtained. The calibration includes timing errors of the device that transmits the beacon as well as the timing errors of the device that receives the beacon so that it can compensate for timing deviations in both sides of the link.

An additional benefit of the embodiments is the absence of an explicit calibration period since the calibration is integrated in the sleep period. This has the benefit that the calibration repeats every beacon period which helps against temperature variations. The temperature variations associated with the operational modes on both sides of the links are included in the calibration, like the temperature profile caused by switching on and off the RF power amplifier. There is no need to turn on the crystal oscillator to calibrate the low power oscillator which saves power as well. In the hardware implementation, the counter(s) that are used to determine the sleep time can also be used to timely wake up and start the receiver.

As an example, the counting of pulses start when the event K is detected and continues counting when a low power state is entered. The receiver will be powered up from the low power state when the counter reaches a wake up threshold. The counter continues running after the wake up. When event K+1 is detected the calibration controller can calculate an updated sleep time, or wake up threshold, based on the pulse count between event K and K+1. The updated sleep time, or wake up threshold, can be used to wake up the receiver in time for the next frame that contains event K+2. Etc. . . .

Figure 4:
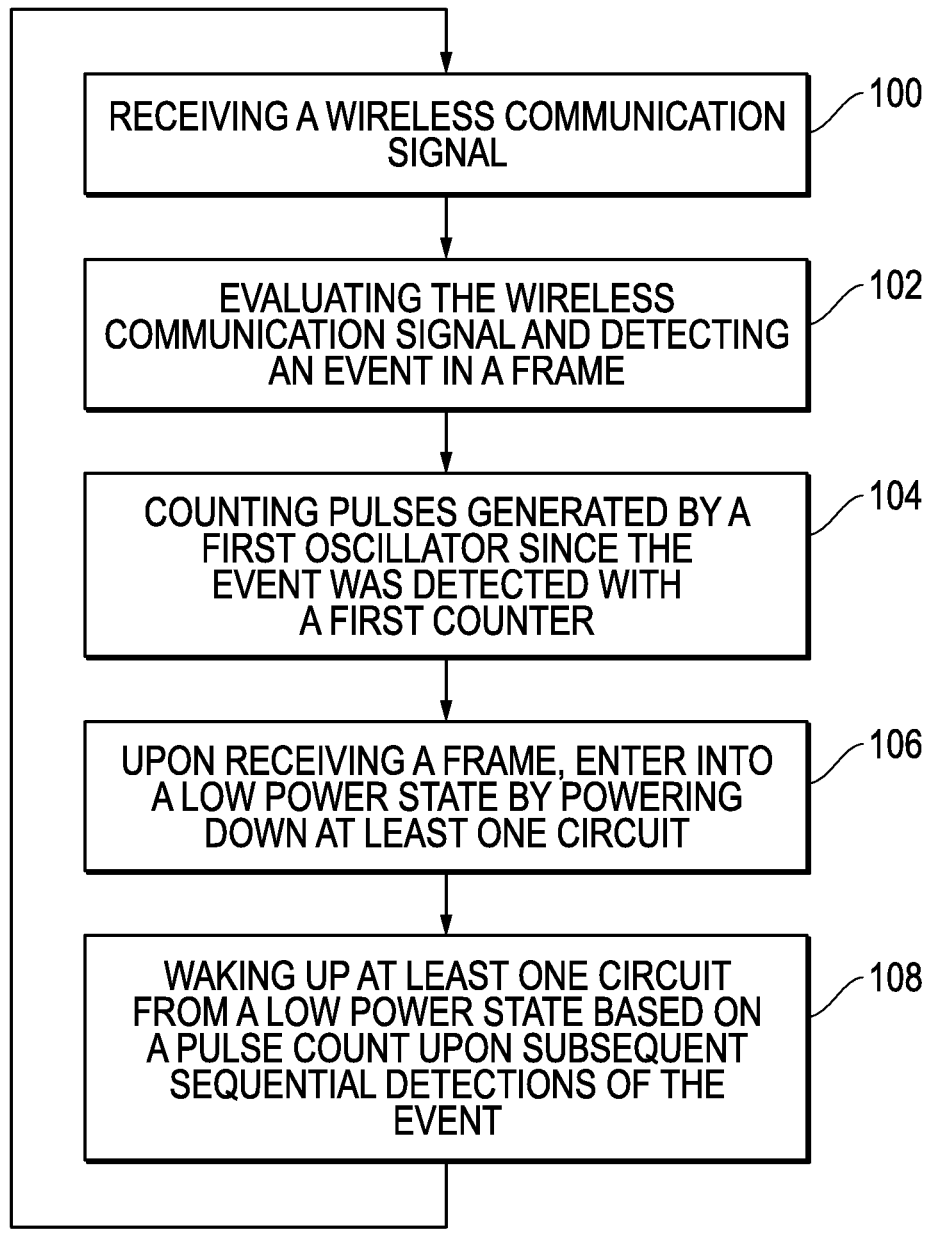
FIG. 4 is a flowchart that illustrates a method for waking up a circuit of a wireless transceiver according to one embodiment.

FIG. 4 is a flowchart that illustrates a method for waking up a circuit of a wireless transceiver according to one embodiment. The method commences with a radio receiver receiving a wireless communication signal (100). The method further includes the wireless transceiver evaluating the wireless communication signal that was received and detecting an event in a frame (102). The event may be, for example, a specific point, transition, beginning, or ending of a signal, header or payload in a beacon signal. More specifically, the event may be triggered by any one of a sync word, a payload, a preamble, a beacon frame or a connection event. The event may be a beginning, ending or specific point in relation to any of these.

Thereafter, the method includes counting pulses generated by a first oscillator since the event was detected with a first counter (104). The method further includes, upon receiving a frame, entering into a low power state by powering down at least one circuit to initiate a sleep period for the at least one circuit (106). Thereafter, the method terminates with waking up at least one circuit from a low-power state based on a pulse count upon subsequent sequential detections of the event (108). The method repeats by receiving a wireless communication signal (100).

Figure 5:
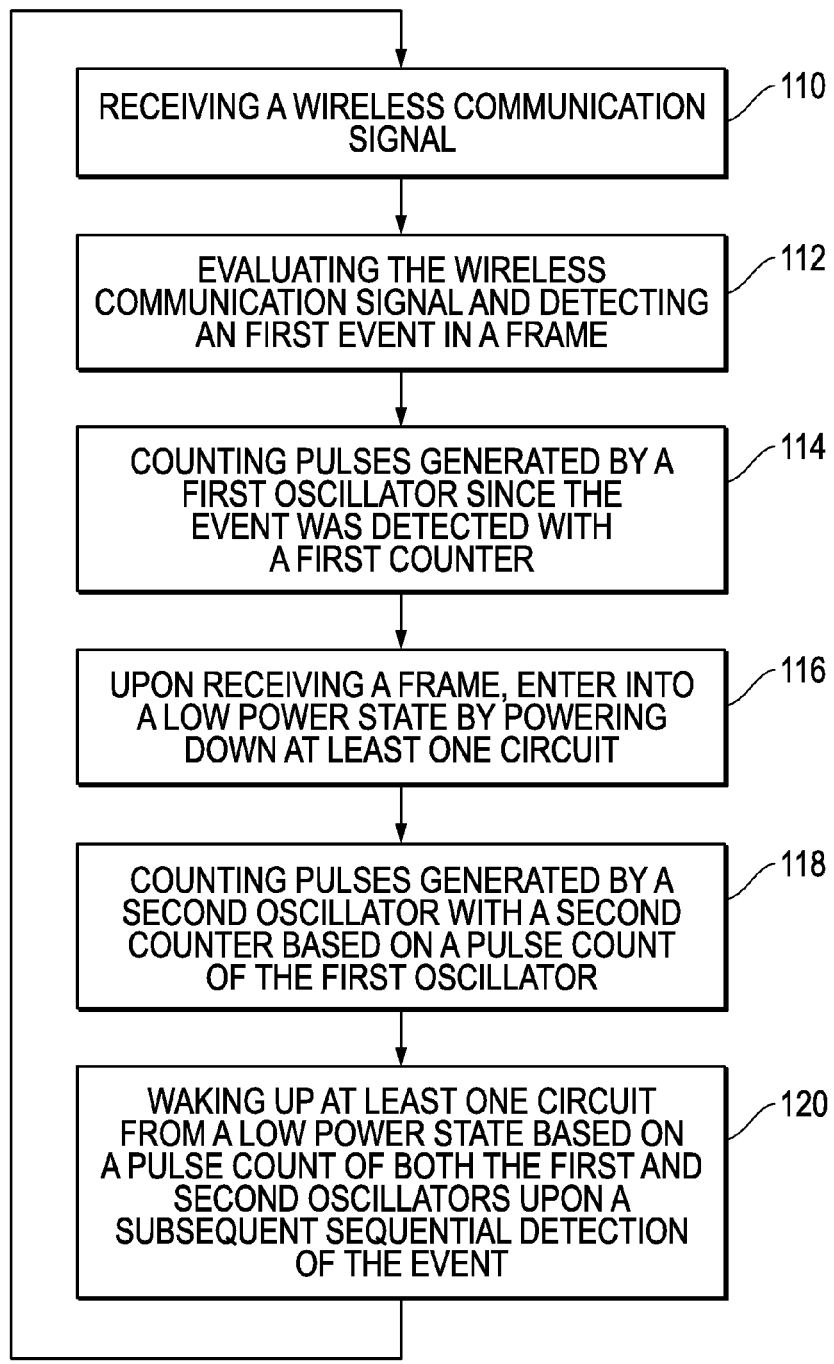
FIG. 5 is a flowchart that illustrates a method for waking up a circuit of a wireless transceiver according to one embodiment.

FIG. 5 is a flowchart that illustrates a method for waking up a circuit of a wireless transceiver according to one embodiment. The method commences with a wireless transceiver receiving a wireless communication signal (110) and evaluating the wireless communication signal and detecting an event in a frame (112). The method further includes counting pulses generated by a first oscillator since the event was detected with a first counter (114). The method continues by entering a low power state after a frame was received (116). The method further includes counting pulses generated by a second oscillator with a second counter based on a pulse count of the first oscillator (118). In the described embodiment, one oscillator is a high frequency oscillator with high resolution (e.g., a crystal oscillator) while another is a low frequency oscillator with lower resolution (e.g. an RC oscillator).

Steps 114 and 116 correspond to a calibration process for measuring the actual timing between subsequent events. After the timing is calibrated, the method includes receiving a frame and entering into a lower power (sleep) state by powering down at least one circuit (118). Finally the method includes waking up at least one circuit from a low-power state based on a pulse count of both the first and second oscillators upon a subsequent sequential detection of the event. (120). In one embodiment, this step may include counting pulses generated by a second oscillator with a second counter based on a pulse count of the first oscillator. The method repeats by receiving a wireless communication signal (110).

Generally, the methods illustrated in FIGS. 4 and 5 support several different operations. The counter connected to a crystal oscillator may be used to determine a sleep time, the counter used to count pulses of a low-power oscillator may be used to determine a sleep time, or a combination of the counters used to count pulses of the low-power oscillator and the crystal oscillator may be used to determine a sleep time.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:
1. A wireless transceiver, comprising:
receiver front end wireless circuitry for processing an ingoing radio frequency (RF) signal to produce an in-going digital signal;
a processor coupled to receive the in-going digital signal, the processor including event determination logic configured to identify an event and to subsequently generate an event determination signal;
a first oscillator that generates oscillation pulses;
a first counter that counts the oscillation pulses of the first oscillator in response to the event determination signal to produce first pulse counts; and
a calibration controller that receives the first pulse counts from the first counter and the event determination signal and determines a sleep time based on the first pulse counts from the first counter in relation to subsequent event determination signals.

2. The wireless transceiver of claim 1 further comprising a second oscillator and a second counter that counts pulses of the second oscillator to produce second pulse counts.

3. The wireless transceiver of claim 2 wherein the calibration controller is configured to determine sleep times based on the first and second pulse counts from the first and second counters in relation to the subsequent event determination signals.

4. The wireless transceiver of claim 2 wherein the calibration controller is configured to activate and deactivate the second oscillator based on the first pulse counts from the first counter since the event determination signal was generated and to determine sleep times based on first and second pulse counts from the first and second counters in relation to the subsequent event determination signals.

5. The wireless transceiver of claim 2 wherein the second oscillator is a high frequency crystal oscillator.

6. The wireless transceiver of claim 1 wherein the first oscillator is a low power oscillator.

7. The wireless transceiver of claim 1 wherein the calibration controller is configured to determine wake up times based on the first pulse count in relation to a received sync word, source address, network ID and frame type.

8. The wireless transceiver of claim 1 wherein the event determination signal is generated upon determining at least one of:
 a sync word;
 a payload;
 a preamble;
 a source address;
 a frame type;
 a network ID;
 a beacon frame; and
 a connection event.

9. The wireless transceiver of claim 1 wherein the first pulse counts are produced for common portions of sequential sync words having at least one of a common source ID and a network ID.

10. The wireless transceiver of claim 1 wherein pulses are first pulse counts are produced for common portions of sequential sync words only for specified frame types.

11. The wireless transceiver of claim 1 further including a second oscillator and a second counter that produces second pulse counts wherein the first oscillator is a low power low frequency oscillator and the second oscillator is a crystal oscillator.

12. The wireless transceiver of claim 11 wherein the wireless transceiver determines the sleep time based upon a predetermined Allen deviation for an expected drift time in relation to subsequent event determination signals.

13. The wireless transceiver of claim 11 wherein the wireless transceiver counts pulses from the low power low frequency oscillator to determine sleep time.

14. The wireless transceiver of claim 11 wherein the wireless transceiver counts pulses from the crystal oscillator and the low power low frequency oscillator to determine sleep time.

15. The wireless transceiver of claim 11 wherein first and second pulse counts are produced for a same portion of sequential sync words to determine a number of first and second pulse counts that should be used to determine to the sleep time for at least one circuit that is in a low power state.

16. A method for waking up a circuit of a wireless transceiver, comprising:
 receiving a wireless communication signal and detecting an event;
 counting pulses generated by a first oscillator in relation to subsequent event detections;
 generating a first pulse count;
 waking up at least one circuit from a low power state based on a pulse count in relation to subsequent event detections; and
 counting pulses generated by a second oscillator since the event was detected with a second counter and generating a second pulse count,
 wherein pulses are counted between a same portion of sequential sync words to determine the first and second pulse counts of the first and second oscillators for determination of a wake up of at least one circuit that is in the low power state.

17. The method of claim 16 further including waking up at least one circuit based on the first and second pulse counts.

18. The method claim 16 wherein the second pulse count is based on the first pulse count.

19. A wireless transceiver, comprising:
 receiver front end circuitry for processing an ingoing radio frequency (RF) signal to produce an in-going digital signal;
 a processor coupled to receive the in-going digital signal, the processor including sync word determination logic configured to identify a received sync word and to subsequently generate an event determination signal;
 a low power oscillator;
 a crystal oscillator;
 first and second counters configured to count oscillation pulses of the low power oscillator and the crystal oscillator in response to the event determination signal to generate first and second pulse counts, respectively;
 a calibration controller that receives at least one of the first and second pulses counts from at least one of the first and second counters and determines a period between a common event of subsequent beacon signals or connection events; and
 determines sleep times based on the received first and second pulse counts from at least one of the first and second counters.

20. The wireless transceiver of claim 19 wherein the transceiver is configured to:
 determine a first wake up time for the crystal oscillator based on the first pulse counts; and
 determine a subsequent wake up time for a circuit, device, block or element based on the second pulse counts.

21. The wireless transceiver of claim 20 wherein the second pulse counts are based on the first pulse counts.

* * * * *